United States Patent
Knoop

(10) Patent No.: US 11,675,327 B2
(45) Date of Patent: Jun. 13, 2023

(54) FAULT DETECTION IN POWER SUPPLY TO A LOAD IN TERMS OF A BROKEN WIRE DETECTION FOR A FUNCTIONAL SAFETY DC OUTPUT

(71) Applicant: Siemens Industry, Inc., Alpharetta, GA (US)

(72) Inventor: James Allen Knoop, Flag Pond, TN (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 180 days.

(21) Appl. No.: 17/051,020

(22) PCT Filed: May 25, 2018

(86) PCT No.: PCT/US2018/034609
§ 371 (c)(1),
(2) Date: Oct. 27, 2020

(87) PCT Pub. No.: WO2019/226171
PCT Pub. Date: Nov. 28, 2019

(65) Prior Publication Data
US 2021/0123983 A1 Apr. 29, 2021

(51) Int. Cl.
*G05B 19/05* (2006.01)
*G01R 31/54* (2020.01)
(Continued)

(52) U.S. Cl.
CPC ........ *G05B 19/054* (2013.01); *G01R 31/40* (2013.01); *G01R 31/54* (2020.01); *G01R 31/58* (2020.01); *G05B 2219/1105* (2013.01)

(58) Field of Classification Search
CPC .......... G05B 19/054; G05B 2219/1105; G01R 31/40; G01R 31/54; G01R 31/58
(Continued)

(56) References Cited

U.S. PATENT DOCUMENTS 6,232,781 B1 * 5/2001 Goser ................... F02D 41/221
324/415
2001/0048367 A1 12/2001 Wimmer et al.
(Continued)

FOREIGN PATENT DOCUMENTS

CN 104220887 A 12/2014
CN 104583787 A 4/2015
(Continued)

OTHER PUBLICATIONS

PCT International Search Report and Written Opinion of International Searching Authority dated Feb. 11, 2019 corresponding to PCT International Application No. PCT/US2018/034609 filed May 25, 2018.

*Primary Examiner* — Giovanni Astacio-Oquendo

(57) ABSTRACT

An apparatus is provided for detecting fault conditions in the energy supply of a load. The apparatus comprises a fail-safe input-output (I/O) module circuit and a diagnostic circuit coupled to the fail-safe input-output (I/O) module circuit. The fail-safe input-output (I/O) module circuit includes a first switch coupled to a first resistor divider and a first output that supplies a DC supply voltage to the load via a first wiring to reduce a first voltage of the first output down to a first readback diagnostic output and a second switch coupled to a second resistor divider and a second output that supplies the DC supply voltage to the load via a second wiring to reduce a second voltage of the second output down to a second readback diagnostic output. The diagnostic circuit is to provide a first readback measurement signal from the first readback diagnostic output and provide a (Continued)

second readback measurement signal from the second readback diagnostic output. The apparatus is configured to provide the first readback measurement signal and the second readback measurement signal for the first output and the second output with and without the load such that when the first and second switches are open or OFF the first voltage at the first output with the load and the second voltage at the second output with the load indicate a NOT broken wire condition with respect to the first and second wirings while the first voltage at the first output without the load and the second voltage at the second output without the load indicate a broken wire condition with respect to the first and second wirings.

16 Claims, 5 Drawing Sheets

(51) Int. Cl.
*G01R 31/58* (2020.01)
*G01R 31/40* (2020.01)

(58) Field of Classification Search
USPC .................................. 324/764.01, 537, 500
See application file for complete search history.

(56) References Cited

U.S. PATENT DOCUMENTS

| | | | |
|---|---|---|---|
| 2017/0296056 A1* | 10/2017 | Hresko | A61B 5/0015 |
| 2018/0026624 A1 | 1/2018 | Baik et al. | |
| 2020/0001048 A1* | 1/2020 | Oren | G06T 5/002 |
| 2020/0166495 A1* | 5/2020 | Stokoe | G01N 29/222 |
| 2020/0338351 A1* | 10/2020 | Panken | A61B 5/7221 |
| 2021/0050718 A1* | 2/2021 | Djelassi-Tscheck | H02H 9/02 |

FOREIGN PATENT DOCUMENTS

| | | |
|---|---|---|
| GB | 2300530 A | 11/1996 |
| JP | 2016111766 A | 6/2016 |
| WO | 2009115869 A1 | 9/2009 |

* cited by examiner

FIG. 7

| | P-Switch=Closed<br>M-Switch=Closed | P-Switch=Open<br>M-Switch=Closed | P-Switch=Closed<br>M-Switch=Open | P-Switch=Open<br>M-Switch=Open |
|---|---|---|---|---|
| M-Output | M-Output=~VDD | M-Output=~0V | $\text{M-Output} = \dfrac{VDD \times (R4+R5)}{(R4+R5)+(R3 \| Load)}$ | $\text{M-Output} = \dfrac{(VDD-V1) \times [(R4+R5) \| (Load+R1+R2)]}{R3+[(R4+R5) \| (Load+R1+R2)]}$ |
| P-Output | P-Output=~0V | P-Output=~0V | P-Output=~VDD | $\text{P-Output} = \dfrac{\text{M-Output} \times (R1+R2)}{Load+R1+R2}$ |

FIG. 8

| P-Switch | M-Switch | P Output with Load | M Output with Load | P Output without Load | M Output without Load |
|---|---|---|---|---|---|
| Closed/On | Closed/On | Hi/~VDD | Low/~0V | Hi/~VDD | Low/~0V |
| Open/Off | Closed/On | Low/~0V | Low/~0V | Low/~0V | Low/~0V |
| Closed/On | Open/Off | Hi/~VDD | Hi/~VDD | Hi/~VDD | Hi/~VDD |
| Open/Off | Open/Off | Mid/~Percentage 1 of (VDD-V1) | Mid/~Percentage 2 of (VDD-V1) | Low/~0V | Hi/~2L+ |

| P-Switch Expected State | M-Switch Expected State | P Output Readback | M Output Readback | Meaning |
|---|---|---|---|---|
| Open/Off | Open/Off | Threshold 1 to Threshold 2 | Threshold 3 to Threshold 4 | Output Off- Load Connected |
| Open/Off | Open/Off | <Threshold 1 | >Threshold 4 | Output Off- Broken Wire |

FAULT DETECTION IN POWER SUPPLY TO A LOAD IN TERMS OF A BROKEN WIRE DETECTION FOR A FUNCTIONAL SAFETY DC OUTPUT

BACKGROUND

1. Field

Aspects of the present invention generally relate to fault detection in the power supply to a load in terms of broken wire detection for a functional safety DC output on an industrial control, e.g., a programmable logic controller (PLC).

2. Description of the Related Art

It is already known to implement a wire break detection and/or overload detection in that integrated output drivers are used that have the wire break detection and overload detection "on chip". These output drivers, it is not possible to parameterize the open-circuit or overload detection and keep track of the current consumption of the actuator and the load. Another disadvantage of a known protection switching device is that the measuring resistor used in the current path is arranged themselves. This leads in normal operation of the protective circuit device to an undesired heat generation or power loss.

A method is needed for detecting a wire break (broken wire, missing load) for a 24V DC output on an industrial control (e.g., a programmable logic controller (PLC)). The output/load is for functional safety applications where the load is switched on both the positive and negative side of the load (a PM configuration).

In some products fail-safe input-output (I/O) modules, an additional switch with a series sense resistor are placed in parallel to the high-side switch. The voltage across the sense resistor is used to determine if current is flowing in the load by turning OFF the high-side switch and turning ON the switch with the series sense resistor. When the wire to the load breaks or the load is missing, the voltage across the sense resistor will be below a threshold. For some products the addition of the extra switch and sense resistor is too expensive and/or take up too much room in the product, so in this case the product does not have wire break detection.

Therefore, there is a need for a device for detecting fault conditions in the power supply of a load.

SUMMARY

Briefly described, aspects of the present invention relate to an architecture of a PM output circuit and a readback diagnostic circuit. Resistors form a first resistor divider to reduce a voltage of a P-output down to a P-Readback. The P-Readback can be examined by lower voltage circuits. Resistors form a second resistor divider to reduce a voltage of a M-output down to a M-Readback. The M-Readback can be examined by lower voltage circuits. A resistor and a diode may bias the M-output when a M-switch is OFF. An apparatus for detecting fault conditions in the energy supply of a load may comprise a fail-safe input-output (I/O) module circuit including: a first switch coupled to a first resistor divider and a first output that supplies a DC supply voltage to the load via a first wiring to reduce a first voltage of the first output down to a first readback diagnostic output, a second switch coupled to a second resistor divider and a second output that supplies the DC supply voltage to the load via a second wiring to reduce a second voltage of the second output down to a second readback diagnostic output and a diagnostic circuit coupled to the fail-safe input-output (I/O) module circuit. The diagnostic circuit is to provide a first readback measurement signal from the first readback diagnostic output and provide a second readback measurement signal from the second readback diagnostic output. The apparatus is configured to provide the first readback measurement signal and the second readback measurement signal for the first output and the second output with and without the load such that when the first and second switches are open or OFF the first voltage at the first output with the load and the second voltage at the second output with the load indicate a NOT broken wire condition with respect to the first and second wirings while the first voltage at the first output without the load and the second voltage at the second output without the load indicate a broken wire condition with respect to the first and second wirings.

In accordance with one illustrative embodiment of the present invention, an apparatus for detecting fault conditions in the energy supply of a load is provided. The apparatus comprises a fail-safe input-output (I/O) module circuit a diagnostic circuit coupled to the fail-safe input-output (I/O) module circuit. The fail-safe input-output (I/O) module circuit includes an input for a DC supply voltage, a first output for supplying the DC supply voltage to a first terminal of the load via a first wiring and a second output for supplying the DC supply voltage to a second terminal of the load via a second wiring. The fail-safe input-output (I/O) module circuit further includes a first switch coupled to a first resistor divider and the first output to reduce a first voltage of the first output down to a first readback diagnostic output and a second switch coupled to a second resistor divider and the second output to reduce a second voltage of the second output down to a second readback diagnostic output. The fail-safe input-output (I/O) module circuit further includes a resistor and a diode to bias the second output when the second switch is open or OFF. The diagnostic circuit includes a first lower voltage circuit coupled to the first readback diagnostic output in series to provide a first readback measurement signal and a second lower voltage circuit coupled to the second readback diagnostic output in series to provide a second readback measurement signal. The apparatus is configured to provide the first readback measurement signal and the second readback measurement signal for the first output and the second output with and without the load such that when the first and second switches are open or OFF the first voltage at the first output with the load and the second voltage at the second output with the load indicate a NOT broken wire condition with respect to the first and second wirings while the first voltage at the first output without the load and the second voltage at the second output without the load indicate a broken wire condition with respect to the first and second wirings.

In accordance with another illustrative embodiment of the present invention, an apparatus is provided for detecting fault conditions in the energy supply of a load. The apparatus comprises a fail-safe input-output (I/O) module circuit and a diagnostic circuit coupled to the fail-safe input-output (I/O) module circuit. The fail-safe input-output (I/O) module circuit includes a first switch coupled to a first resistor divider and a first output that supplies a DC supply voltage to the load via a first wiring to reduce a first voltage of the first output down to a first readback diagnostic output. The fail-safe input-output (I/O) module circuit further includes a second switch coupled to a second resistor divider and a second output that supplies the DC supply voltage to the load via a second wiring to reduce a second voltage of the second output down to a second readback diagnostic output. The diagnostic circuit is to provide a first readback measurement signal from the first readback diagnostic output and provide a second readback measurement signal from the second readback diagnostic output. The apparatus is configured to provide the first readback measurement signal and the second readback measurement signal for the first output and the second output with and without the load such that when the first and second switches are open or OFF the first voltage at the first output with the load and the second voltage at the second output with the load indicate a NOT broken wire condition with respect to the first and second wirings while the first voltage at the first output without the load and the second voltage at the second output without the load indicate a broken wire condition with respect to the first and second wirings.

In accordance with yet another illustrative embodiment of the present invention, a method is provided for detecting fault conditions in the energy supply of a load. The method comprises providing a fail-safe input-output (I/O) module circuit including a first switch coupled to a first resistor divider and a first output that supplies a DC supply voltage to the load via a first wiring to reduce a first voltage of the first output down to a first readback diagnostic output and a second switch coupled to a second resistor divider and a second output that supplies the DC supply voltage to the load via a second wiring to reduce a second voltage of the second output down to a second readback diagnostic output. The method further comprises providing a diagnostic circuit coupled to the fail-safe input-output (I/O) module circuit. The diagnostic circuit to provide a first readback measurement signal from the first readback diagnostic output and provide a second readback measurement signal from the second readback diagnostic output. The method further comprises providing the first readback measurement signal and the second readback measurement signal for the first output and the second output with and without the load. When the first and second switches are open or OFF, the method comprises indicating with the first voltage at the first output with the load and the second voltage at the second output with the load a NOT broken wire condition with respect to the first and second wirings. When the first and second switches are open or OFF, the method comprises indicating with the first voltage at the first output without the load and the second voltage at the second output without the load a broken wire condition with respect to the first and second wirings.

BRIEF DESCRIPTION OF THE DRAWINGS

FIG. 7 shows equations for the voltage of a M-Output and a P-Output of the circuit in FIG. 2 in accordance with an exemplary embodiment of the present invention.

FIG. 8 shows a readback state of the expected readback signals for the P-Output and M-Output with and without a load in accordance with an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of a device for detecting fault conditions in the power supply of a load. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
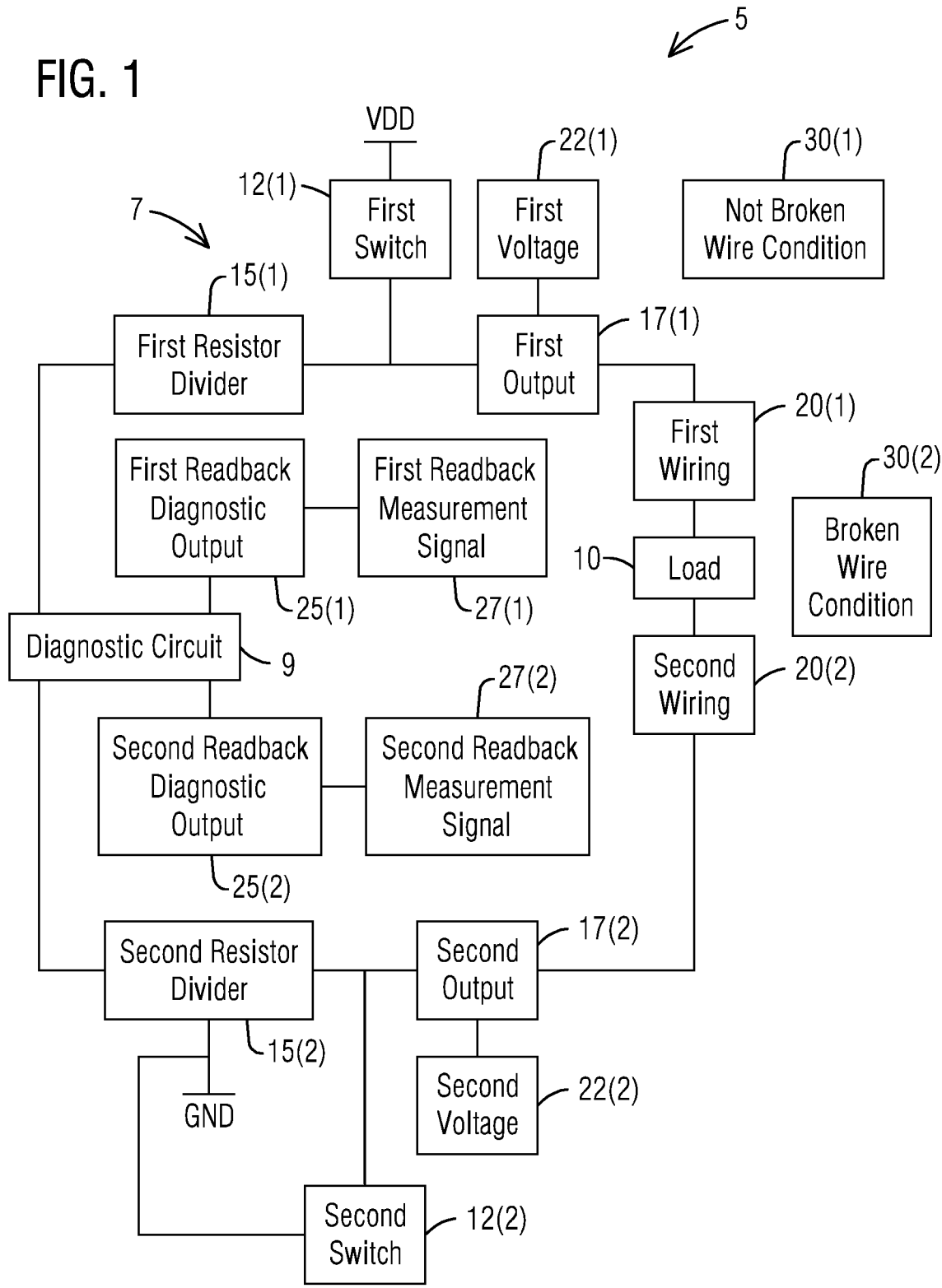
FIG. 1 illustrates schematically an apparatus that includes a fail-safe input-output (I/O) module circuit and a diagnostic circuit for detecting fault conditions in the energy supply of a load in accordance with an exemplary embodiment of the present invention.

Consistent with one embodiment of the present invention, FIG. 1 represents schematically an apparatus 5 that includes a fail-safe input-output (I/O) module circuit 7 and a diagnostic circuit 9 for detecting fault conditions in the energy supply of a load 10 in accordance with an exemplary embodiment of the present invention.

The fail-safe input-output (I/O) module circuit 7 includes a first switch 12(1) coupled to a first resistor divider 15(1) and a first output 17(1) that supplies a DC supply voltage to the load 10 via a first wiring 20(1) to reduce a first voltage 22(1) of the first output 17(1) down to a first readback diagnostic output 25(1). The fail-safe input-output (I/O) module circuit 7 further includes a second switch 12(2) coupled to a second resistor divider 15(2) and a second output 17(2) that supplies the DC supply voltage to the load 10 via a second wiring 20(2) to reduce a second voltage 22(2) of the second output 17(2) down to a second readback diagnostic output 25(2).

The diagnostic circuit 9 is coupled to the fail-safe input-output (I/O) module circuit 7. The diagnostic circuit 9 to provide a first readback measurement signal 27(1) from the first readback diagnostic output 25(1) and provide a second readback measurement signal 27(2) from the second readback diagnostic output 25(2).

The apparatus 5 is configured to provide the first readback measurement signal 27(1) and the second readback measurement signal 27(2) for the first output 17(1) and the second output 17(2) with and without the load 10 such that when the first and second switches 12(1-2) are open or OFF the first voltage 22(1) at the first output 17(1) with the load 10 and the second voltage 22(2) at the second output 17(2) with the load 10 indicate a NOT broken wire condition 30(1) with respect to the first and second wirings 20(1-2) while the first voltage 22(1) at the first output 17(1) without the load 10 and the second voltage 22(2) at the second output 17(2) without the load 10 indicate a broken wire condition 30(2) with respect to the first and second wirings 20(1-2).

In all cases except when the first switch 12(1) and the second switch 12(2) are both open or OFF, the first output 17(1) and the second output 17(2) have the same voltage if the load 10 is connected or if the load 10 is not connected. When the first switch 12(1) and the second switch 12(2) are both open or OFF, the first output 17(1) and the second output 17(2) have a different voltage if the load 10 is connected or if the load 10 is not connected.

The broken wire condition 30(2) or a missing load condition is discovered by examining voltage levels of the first output 17(1) and the second output 17(2) when both the first and second switches 12(1-2) are open or OFF. The thresholds for detecting a broken wire as a percentage of the DC supply voltage are used for the first output 17(1) and the second output 17(2) to determine whether there is the broken wire condition 30(2) or the missing load condition or there is a load connected condition. The first readback measurement signal 27(1) between a threshold1 and a threshold2 and the second readback measurement signal 27(2) between a threshold3 and a threshold4 indicates an output OFF condition or a load connected condition and wherein the first readback measurement signal 27(1) less than the threshold1 and the second readback measurement signal 27(2) between greater than the threshold4 indicates an output OFF condition or the broken wire condition 30(2).

Figure 2:
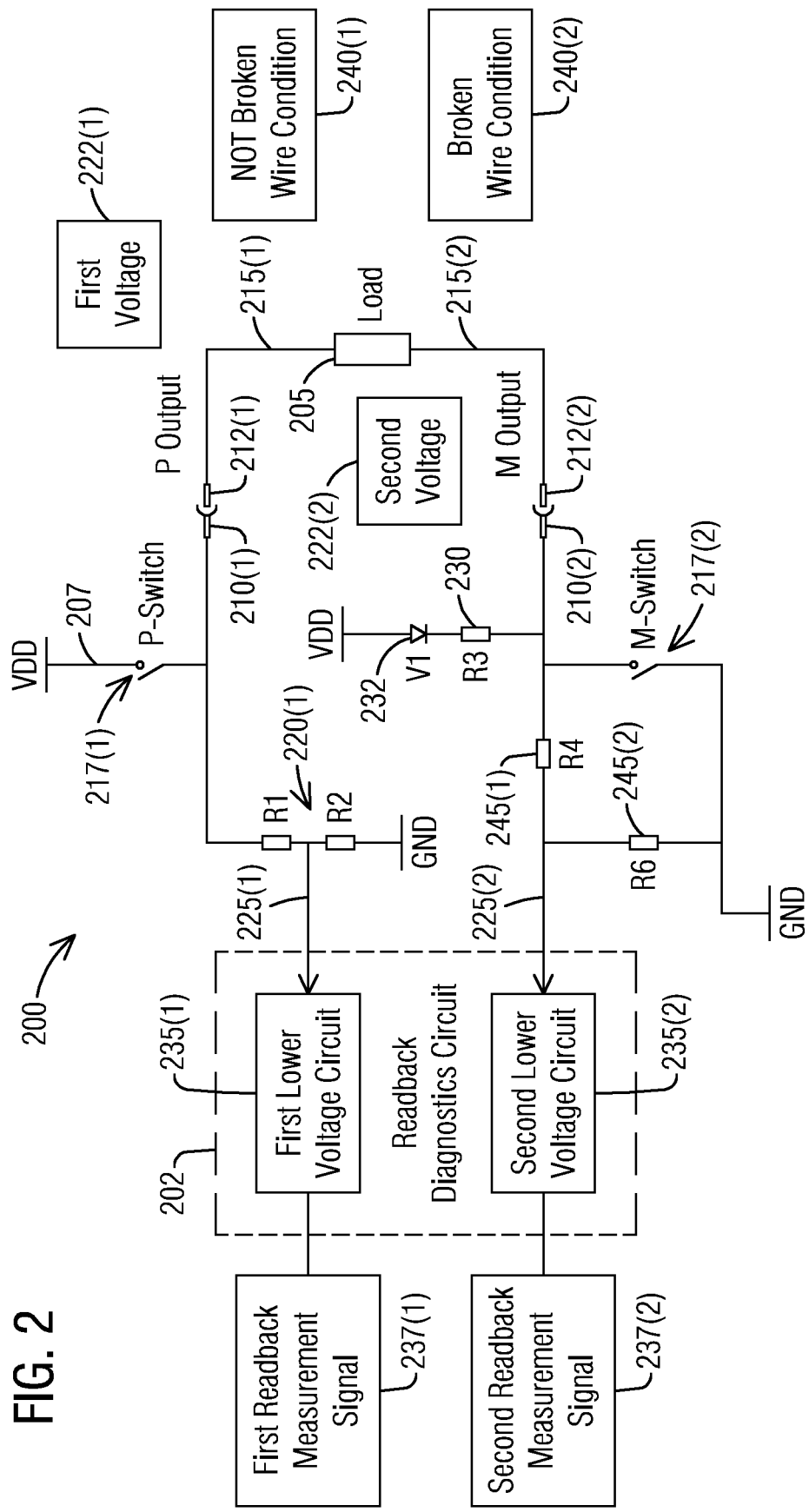
FIG. 2 illustrates a circuit schematic of a PM output circuit with a readback diagnostics circuit in accordance with an exemplary embodiment of the present invention.

Referring to FIG. 2, it illustrates a circuit schematic of a PM output circuit 200 with a readback diagnostics circuit 202 in accordance with an exemplary embodiment of the present invention. The combination of the PM output circuit 200 and the readback diagnostics circuit 202 represents an apparatus for detecting fault conditions in the energy supply of a load 205. The PM output circuit 200 is a fail-safe input-output (I/O) module circuit that includes an input 207 for a DC supply voltage. The PM output circuit 200 further includes a first output 210(1) for supplying the DC supply voltage to a first terminal 212(1) of the load 205 via a first wiring 215(1). The PM output circuit 200 further includes a second output 210(2) for supplying the DC supply voltage to a second terminal 212(2) of the load 205 via a second wiring 215(2). The PM output circuit 200 further includes a first switch 217(1) coupled to a first resistor divider 220(1) and the first output 210(1) to reduce a first voltage 222(1) of the first output 210(1) down to a first readback diagnostic output 225(1). The PM output circuit 200 further includes a second switch 217(2) coupled to a second resistor divider 220(2) and the second output 210(2) to reduce a second voltage 222(2) of the second output 210(2) down to a second readback diagnostic output 225(2). The PM output circuit 200 further includes a resistor 230 and a diode 232 to bias the second output 210(2) when the second switch 217(2) if open or OFF.

The readback diagnostics circuit 202 is a diagnostic circuit that is coupled to the PM output circuit 200 being the fail-safe input-output (I/O) module circuit. The readback diagnostics circuit 202 includes a first lower voltage circuit 235(1) coupled to the first readback diagnostic output 225(1) in series to provide a first readback measurement signal 237(1). The readback diagnostics circuit 202 further includes a second lower voltage circuit 235(2) coupled to the second readback diagnostic output 225(2) in series to provide a second readback measurement signal 237(2). The apparatus including the PM output circuit 200 and the readback diagnostics circuit 202 is configured to provide the first readback measurement signal 237(1) and the second readback measurement signal 237(2) for the first output 210(1) and the second output 210(2) with and without the load 205 such that when the first and second switches 217(1-2) are open or OFF the first voltage 222(1) at the first output 210(1) with the load 205 and the second voltage 222(2) at the second output 210(2) with the load 205 indicate a NOT broken wire condition 240(1) with respect to the first and second wirings 215(1-2) while the first voltage 222(1) at the first output 210(1) without the load 205 and the second voltage 222(2) at the second output 210(2) without the load 205 indicate a broken wire condition 240(2) with respect to the first and second wirings 215(1-2).

One architecture of the PM output circuit 200 and the readback diagnostics circuit 202 is shown in FIG. 2. For example, Resistors R1 and R2 form a first resistor divider to reduce the voltage of the P-output down to P-Readback. P-Readback can be examined by lower voltage circuits. Resistors R4 and R5 form a second resistor divider to reduce the voltage of the M-output down to M-Readback. M-Readback can be examined by lower voltage circuits. Resistor R3 and Diode V1, bias the M-output when the M-switch is OFF. Suggested ratios for the resistors are following.

R1+R2=~R3.
R4+R5>10×R3.
R1+R2>10*maximum Load resistance (e.g., the Load may be an actuator or a motor)

In all cases except when the first switch 217(1) and the second switch 217(2) are both open or OFF, the first output 210(1) and the second output 210(2) have the same voltage if the load 205 is connected or if the load 205 is not connected. When the first switch 217(1) and the second switch 217(2) are both open or OFF, the first output 210(1) and the second output 210(2) have a different voltage if the load 205 is connected or if the load 205 is not connected.

The broken wire condition 240(2) or a missing load condition is discovered by examining voltage levels of the first output 210(1) and the second output 210(2) when both the first and second switches 217 (1-2) are open or OFF. The thresholds for detecting a broken wire as a percentage of the DC supply voltage are used for the first output 210(1) and the second output 210(2) to determine whether there is the broken wire condition 240(2) or the missing load condition or there is a load connected condition.

The first readback measurement signal 237(1) between a threshold1 and a threshold2 and the second readback measurement signal 237(2) between a threshold3 and a threshold4 indicates an output OFF condition or a load connected condition. The first readback measurement signal 237(1) less than the threshold1 and the second readback measurement signal 237(2) between greater than the threshold4 indicates an output OFF condition or the broken wire condition 240(2). In one embodiment, the DC supply voltage is 24V, the threshold1 is 24% of 24V, the threshold2 is 58% of 24V, the threshold3 is 38% of 24V, and the threshold4 is 69% of 24V.

The first readback measurement signal 237(1) and the second readback measurement signal 237(2) may be fed to an analog to digital converter (ADC) which is then read by a microprocessor to determine if criteria are met for the broken wire condition 240(2). Alternatively, first and second comparators may be used to check for the thresholds and then a state of the thresholds is interrogated by a microprocessor to see if criteria are met for the broken wire condition 240(2). In one embodiment, a resistance of a resistor R4 245(1) in series with a resistor R5 245(2) is large in comparison to a resistance of the resistor R3 230 in parallel with the load 205.

Figure 3:
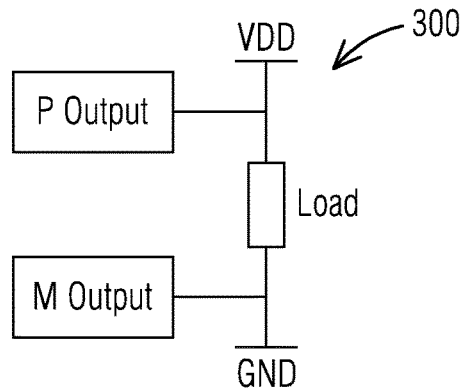
FIG. 3 illustrates schematically an equivalent circuit of the circuit in FIG. 2 being in a first combination of a P-Switch and a M-Switch as open or close in accordance with an exemplary embodiment of the present invention.

Turning now to FIG. 3, it illustrates schematically an equivalent circuit 300 of a circuit in FIG. 2 including the PM output circuit 200 and the readback diagnostics circuit 202 being in a first combination of a P-Switch and a M-Switch as open or close in accordance with an exemplary embodiment of the present invention. In this configuration, the P-Switch and the M-Switch are both closed. A voltage for a M-output 305(1) may be "−VDD" and a voltage for a P-output 305(2) may be "−0V".

Figure 4:
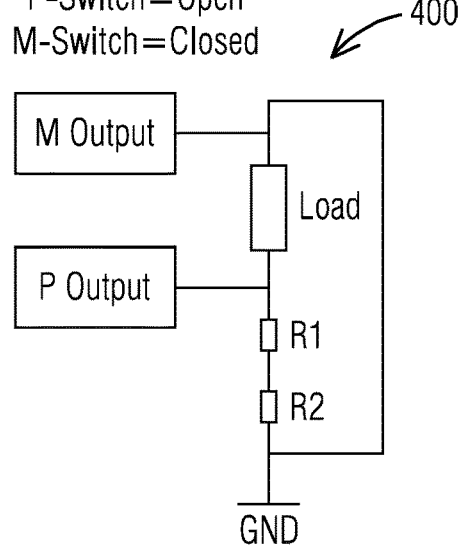
FIG. 4 illustrates schematically an equivalent circuit of the circuit in FIG. 2 being in a second combination of a P-Switch and a M-Switch as open or close in accordance with an exemplary embodiment of the present invention.

FIG. 4 illustrates schematically an equivalent circuit 400 of a circuit in FIG. 2 including the PM output circuit 200 and the readback diagnostics circuit 202 being in a second combination of a P-Switch and a M-Switch as open or close in accordance with an exemplary embodiment of the present invention. In this configuration, the P-Switch is open and the M-Switch is closed. A voltage for a M-output 405(1) may be "−0V" and a voltage for a P-output 405(2) may be "−0V".

Figure 5:
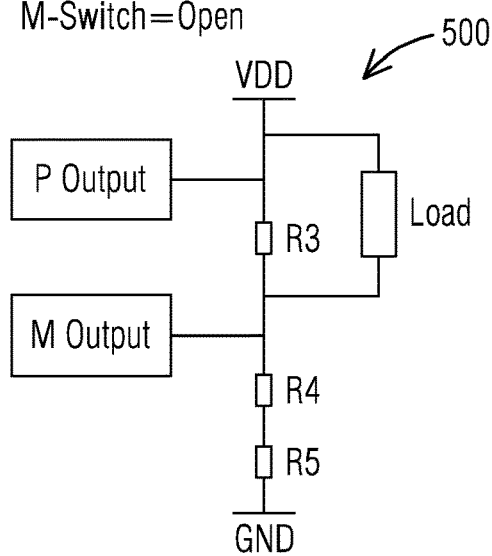
FIG. 5 illustrates schematically an equivalent circuit of the circuit in FIG. 2 being in a third combination of a P-Switch and a M-Switch as open or close in accordance with an exemplary embodiment of the present invention.

As seen in FIG. 5, it illustrates schematically an equivalent circuit 500 of a circuit in FIG. 2 including the PM output circuit 200 and the readback diagnostics circuit 202 being in a third combination of a P-Switch and a M-Switch as open or close in accordance with an exemplary embodiment of the present invention. In this configuration, the P-Switch is closed, and the M-Switch is open. A voltage for a M-output 505(1) may be "{VDD×(R4+R5)}/{(R4+R5)+(R3∥Load)}" and a voltage for a P-output 505(2) may be "−VDD".

Figure 6:
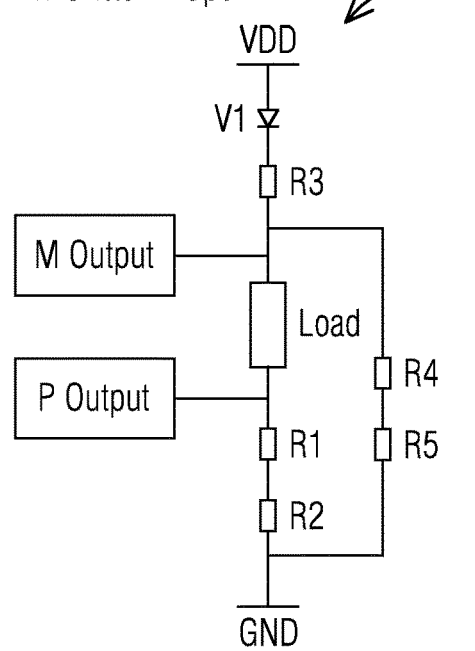
FIG. 6 illustrates schematically an equivalent circuit of the circuit in FIG. 2 being in a fourth combination of a P-Switch and a M-Switch as open or close in accordance with an exemplary embodiment of the present invention.

As shown in FIG. 6, it illustrates schematically an equivalent circuit 600 of a circuit in FIG. 2 including the PM output circuit 200 and the readback diagnostics circuit 202 being in a fourth combination of a P-Switch and a M-Switch as open or close in accordance with an exemplary embodiment of the present invention. In this configuration, the P-Switch and the M-Switch both are open. A voltage for a M-output 605(1) may be "{(VDD−VI)×[(R4+R5)∥(Load+R1+R2)]}/{R3+[(R4+R5)∥(Load+R1+R2)]}" and a voltage for a P-output 605(2) may be "{M-output×(R1+R2)}/{Load+R1+R2}".

In FIG. 7, it shows equations for the voltage of a M-output and a P-output of the circuit in FIG. 2 as described in FIGS. 3-6 in accordance with an exemplary embodiment of the present invention.

With regard to FIG. 8, it shows a readback state of the expected readback signals for the P-output and the M-output with and without a load in accordance with an exemplary embodiment of the present invention. FIG. 8 shows the expected readback signals for the P-output and the M-output with and without a Load. This assumes that there has been enough time for the voltages to stabilize due to capacitive or inductive load effects. It also assumes that the resistance of R4 in series with R5 is large in comparison to the resistance of R3 in parallel with the Load. In all cases except when the P-switch and M-switch are both OPEN/OFF, the P-output and the M-output have the same voltage if there is a Load connected or if there is no Load connected. Since the P-switch and M-switch voltages are different when both switches are OPEN, it is possible to determine when a Load is connected and when a Load is missing. As a result, a broken wire or missing Load can be discovered by examining the voltage levels of the P-output and the M-output switches when both switches are OFF.

Figures 9, 10:
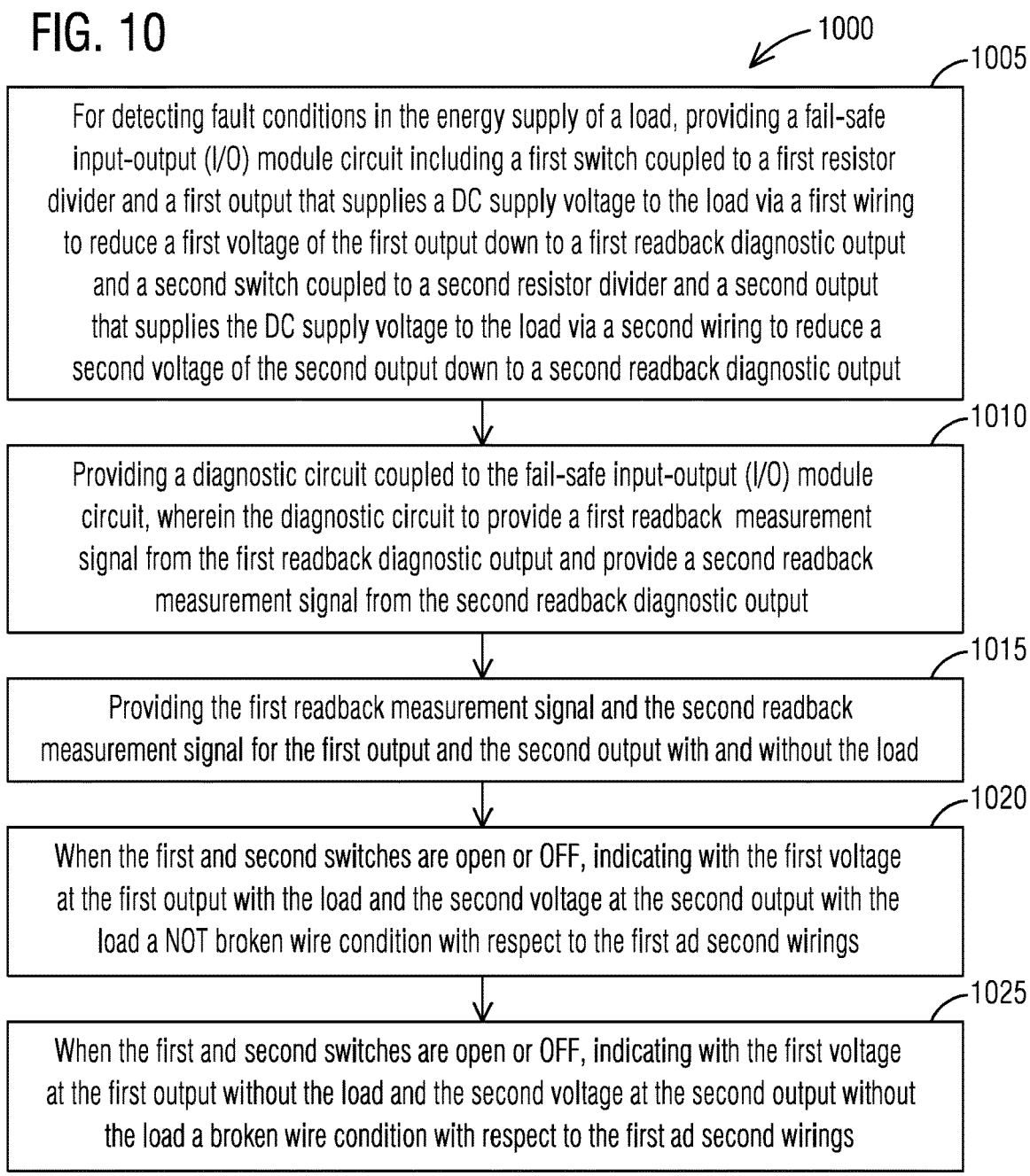
FIG. 9 shows the thresholds used for the P-Output and M-Output for detecting a broken wire of the PM output circuit of FIG. 2 in accordance with an exemplary embodiment of the present invention.
FIG. 10 illustrates a flow chart of a method of detecting fault conditions in the energy supply of a load according to one exemplary embodiment of the present invention.

With respect to FIG. 9, it shows the thresholds used for the P-output and the M-output for detecting a broken wire of the PM output circuit 200 of FIG. 2 in accordance with an exemplary embodiment of the present invention. Threshold1 and Threshold2 are the extremes of Percentage1 when part tolerance, voltage variation, load variation and margin are considered. Threshold3 and Threshold4 are the extremes of Percentage2 when part tolerance, voltage variation, load variation and margin are considered. There are several different methods that can be employed to check for the proper thresholds. In one case, the read-back signals can be taken to an analog to digital converter (ADC) which is then read by a microprocessor to determine if the criteria are met for a broken wire. Another method is to use comparators to check for the thresholds. Then the state of the thresholds could be interrogated by a microprocessor to see if the conditions are met for a broken wire.

One advantage of this solution over prior solutions is the lack of need to add an additional switch with a resistance and a read-back circuit. Because this approach can determine a broken wire using special thresholds/criteria without additional circuitry it has an advantage. The advantage is that the product now has a module with a user visible feature (broken wire) that can be used as a competitive advantage with no additional cost to the product.

FIG. 10 illustrates a flow chart of a method 1000 of detecting fault conditions in the energy supply of a load according to one exemplary embodiment of the present invention. Reference is made to the elements and features described in FIGS. 1-9. It should be appreciated that some steps are not required to be performed in any particular order, and that some steps are optional.

The method 1000 includes a step 1005 of providing a fail-safe input-output (I/O) module circuit. This circuit includes a first switch coupled to a first resistor divider and a first output that supplies a DC supply voltage to the load via a first wiring to reduce a first voltage of the first output down to a first readback diagnostic output and a second switch coupled to a second resistor divider and a second output that supplies the DC supply voltage to the load via a second wiring to reduce a second voltage of the second output down to a second readback diagnostic output.

The method 1000 further includes a step 1010 of providing a diagnostic circuit coupled to the fail-safe input-output (I/O) module circuit. The diagnostic circuit to provide a first readback measurement signal from the first readback diagnostic output and provide a second readback measurement signal from the second readback diagnostic output. The method 1000 further includes a step 1015 providing the first readback measurement signal and the second readback measurement signal for the first output and the second output with and without the load.

When the first and second switches are open or OFF, the method 1000 further includes a step 1020 of indicating with the first voltage at the first output with the load and the second voltage at the second output with the load a NOT broken wire condition with respect to the first and second wirings. When the first and second switches are open or OFF, the method 1000 further includes a step 1025 of indicating with the first voltage at the first output without the load and the second voltage at the second output without the load a broken wire condition with respect to the first and second wirings.

The method 1000 includes in all cases except when the first switch and second switch are both open or OFF, the first output and the second output have the same voltage if the load is connected or if the load is not connected. The method

1000 includes when the first switch and second switch are both open or OFF, the first output and the second output have a different voltage if the load is connected or if the load is not connected.

While fault detection in the power supply to a load in terms of broken wire detection for a functional safety DC output on an industrial control is described here a range of other constructions of fault detection in the power supply to a load are also contemplated by the present invention. For example, other types of functional safety outputs on a control circuit may be implemented based on one or more features presented above without deviating from the spirit of the present invention.

The techniques described herein can be particularly useful for fault detection in the power supply to a load in terms of broken wire detection for a functional safety DC output on an industrial control. While particular embodiments are described in terms of such an industrial control, the fault detection techniques described herein are not limited to the industrial control but can also be used with other suitable applications.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

The invention claimed is:

1. An apparatus for detecting fault conditions in the energy supply of a load, the apparatus comprising:
   a fail-safe input-output (I/O) module circuit including:
   an input for a DC supply voltage;
   a first output for supplying the DC supply voltage to a first terminal of the load via a first wiring;
   a second output for supplying the DC supply voltage to a second terminal of the load via a second wiring;
   a first switch coupled to a first resistor divider and the first output to reduce a first voltage of the first output down to a first readback diagnostic output;
   a second switch coupled to a second resistor divider and the second output to reduce a second voltage of the second output down to a second readback diagnostic output;
   a resistor and a diode to bias the second output when the second switch is open or OFF; and
   a diagnostic circuit coupled to the fail-safe input-output (I/O) module circuit, the diagnostic circuit including:
   a first lower voltage circuit coupled to the first readback diagnostic output in series to provide a first readback measurement signal;
   a second lower voltage circuit coupled to the second readback diagnostic output in series to provide a second readback measurement signal,
   wherein the apparatus is configured to provide the first readback measurement signal and the second readback measurement signal for the first output and the second output with and without the load such that when the first and second switches are open or OFF the first voltage at the first output without the load and the second voltage at the second output without the load indicate a broken wire condition with respect to the first and second wirings,
   wherein the diagnostic circuit provides information with which the apparatus can determine if a wire is broken in that the diagnostic circuit provides logic states of the first and second switches as voltage levels which along with the first readback measurement signal and the second readback measurement signal are sent to a microprocessor that indicates the broken wire condition, and
   wherein the first readback measurement signal and the second readback measurement signal are fed to an analog to digital converter (ADC) which is then read by the microprocessor to determine if criteria are met for the broken wire condition.

2. The apparatus of claim 1, wherein in all cases except when the first switch and second switch are both open or OFF, the first output and the second output have the same voltage if the load is connected or if the load is not connected.

3. The apparatus of claim 2, wherein when the first switch and second switch are both open or OFF, the first output and the second output have a different voltage if the load is connected or if the load is not connected.

4. The apparatus of claim 3, wherein a broken wire condition or a missing load condition is detected by examining voltage levels of the first output and the second output when both the first and second switches are open or OFF.

5. The apparatus of claim 4, wherein thresholds for detecting a broken wire as a percentage of the DC supply voltage are used for the first output and the second output to determine whether there is the broken wire condition or the missing load condition or there is a load connected condition.

6. The apparatus of claim 5, wherein the first readback measurement signal between a threshold1 and a threshold2 and the second readback measurement signal between a threshold3 and a threshold4 indicates an output OFF condition or a load connected condition.

7. The apparatus of claim 6, wherein the first readback measurement signal less than the threshold1 and the second readback measurement signal between greater than the threshold4 indicates an output OFF condition or a broken wire condition.

8. The apparatus of claim 7, wherein the DC supply voltage is 24V, the threshold1 is 24% of 24V, the threshold2 is 58% of 24V, the threshold3 is 38% of 24V, and the threshold4 is 69% of 24V.

9. The apparatus of claim 7, wherein first and second comparators are used to check for the thresholds and then a state of the thresholds is interrogated by a microprocessor to see if criteria are met for the broken wire condition.

10. The apparatus of claim 1, wherein a resistance of a resistor R4 in series with a resistor R5 is large in comparison to a resistance of a resistor R3 in parallel with the load.

11. An apparatus for detecting fault conditions in the energy supply of a load, the apparatus comprising:
    a fail-safe input-output (I/O) module circuit including:
    a first switch coupled to a first resistor divider and a first output that supplies a DC supply voltage to the load via a first wiring to reduce a first voltage of the first output down to a first readback diagnostic output;
    a second switch coupled to a second resistor divider and a second output that supplies the DC supply voltage to the load via a second wiring to reduce a second voltage of the second output down to a second readback diagnostic output; and
    a diagnostic circuit coupled to the fail-safe input-output (I/O) module circuit,
    wherein the diagnostic circuit to provide a first readback measurement signal from the first readback diagnostic output and provide a second readback measurement signal from the second readback diagnostic output, and
    wherein the apparatus is configured to provide the first readback measurement signal and the second readback measurement signal for the first output and the second output with and without the load such that when the first and second switches are open or OFF the first voltage at the first output without the load and the second voltage at the second output without the load indicate a broken wire condition with respect to the first and second wirings,
    wherein the diagnostic circuit provides information with which the apparatus can determine if a wire is broken in that the diagnostic circuit provides logic states of the first and second switches as voltage levels which along with the first readback measurement signal and the second readback measurement signal are sent to a microprocessor that indicates the broken wire condition, and
    wherein the first readback measurement signal and the second readback measurement signal are fed to an analog to digital converter (ADC) which is then read by the microprocessor to determine if criteria are met for the broken wire condition.

12. The apparatus of claim 11, wherein in all cases except when the first switch and second switch are both open or OFF, the first output and the second output have the same voltage if the load is connected or if the load is not connected.

13. The apparatus of claim 12, wherein when the first switch and second switch are both open or OFF, the first output and the second output have a different voltage if the load is connected or if the load is not connected.

14. The apparatus of claim 13, wherein a broken wire condition or a missing load condition is discovered detected by examining voltage levels of the first output and the second output when both the first and second switches are open or OFF.

15. The apparatus of claim 14, wherein thresholds for detecting a broken wire as a percentage of the DC supply voltage are used for the first output and the second output to determine whether there is the broken wire condition or the missing load condition or there is a load connected condition.

16. The apparatus of claim 15, wherein the first readback measurement signal between a threshold1 and a threshold2 and the second readback measurement signal between a threshold3 and a threshold4 indicates an output OFF condition or a load connected condition and wherein the first readback measurement signal less than the threshold1 and the second readback measurement signal between greater than the threshold4 indicates an output OFF condition or a broken wire condition.

* * * * *